US011835628B2

(12) United States Patent
Oh et al.

(10) Patent No.: US 11,835,628 B2
(45) Date of Patent: Dec. 5, 2023

(54) TIME-OF-FLIGHT IMAGE SENSOR

(71) Applicant: Microsoft Technology Licensing, LLC, Redmond, WA (US)

(72) Inventors: Minseok Oh, San Jose, CA (US); Satyadev Hulikal Nagaraja, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 486 days.

(21) Appl. No.: 17/086,768

(22) Filed: Nov. 2, 2020

(65) Prior Publication Data

US 2022/0137222 A1    May 5, 2022

(51) Int. Cl.
| | |
|---|---|
| *G01S 7/48* | (2006.01) |
| *G01S 17/894* | (2020.01) |
| *G01S 7/4865* | (2020.01) |
| *G01S 7/486* | (2020.01) |
| *H01L 27/148* | (2006.01) |
| *G02B 3/00* | (2006.01) |

(52) U.S. Cl.
CPC .......... *G01S 17/894* (2020.01); *G01S 7/4865* (2013.01); *G01S 7/4868* (2013.01); *H01L 27/14812* (2013.01); *H01L 27/14856* (2013.01); *G02B 3/0006* (2013.01)

(58) Field of Classification Search
USPC ....................................................... 356/5.01
See application file for complete search history.

(56) References Cited

U.S. PATENT DOCUMENTS

| | | | |
|---|---|---|---|
| 6,194,770 B1 | 2/2001 | Zarnowski et al. | |
| 7,811,850 B2 | 10/2010 | Mouli et al. | |
| 8,119,433 B2 | 2/2012 | Lim | |
| 9,209,327 B2 | 12/2015 | Neukom et al. | |
| 9,344,657 B2* | 5/2016 | Kim | G01S 7/493 |
| 9,584,744 B2 | 2/2017 | Lenchenkov et al. | |
| 9,609,250 B2 | 3/2017 | Lee et al. | |
| 9,876,044 B2 | 1/2018 | Lee et al. | |
| 2007/0031987 A1* | 2/2007 | Mouli | H01L 27/14603 |
| | | | 438/57 |
| 2009/0166776 A1* | 7/2009 | Lim | H01L 27/14643 |
| | | | 257/431 |
| 2012/0242874 A1* | 9/2012 | Noudo | H01L 27/1464 |
| | | | 348/294 |
| 2014/0203389 A1* | 7/2014 | Neukom | H01L 27/14623 |
| | | | 257/432 |
| 2014/0253905 A1 | 9/2014 | Kim et al. | |
| 2015/0076476 A1* | 3/2015 | Odaka | H10K 71/233 |
| | | | 438/33 |

(Continued)

OTHER PUBLICATIONS

"International Search Report and Written Opinion Issued in PCT Application No. PCT/US2021/048307", dated Jan. 25, 2022, 8 Pages.

*Primary Examiner* — James R Hulka
(74) *Attorney, Agent, or Firm* — Alleman Hall Creasman & Tuttle LLP

(57) ABSTRACT

A time-of-flight image sensor is disclosed. The time-of-flight image sensor includes an array of pixels. Each pixel of the array of pixels includes a first photogate, a second photogate adjacent the first photogate, an isolation barrier intermediate the first photogate and the second photogate, and an in-pixel ground node intermediate the first photogate and the second photogate.

20 Claims, 6 Drawing Sheets

(56) References Cited

U.S. PATENT DOCUMENTS

| | | | |
|---|---|---|---|
| 2016/0056200 A1* | 2/2016 | Lee | H01L 27/1464 |
| | | | 257/292 |
| 2016/0381310 A1* | 12/2016 | Lenchenkov | H01L 27/14609 |
| | | | 257/435 |
| 2017/0040364 A1* | 2/2017 | Oh | H01L 27/14612 |
| 2017/0170216 A1* | 6/2017 | Lee | H01L 27/1463 |
| 2018/0108678 A1* | 4/2018 | Li | G02F 1/134363 |
| 2018/0176492 A1* | 6/2018 | Bamji | G01S 17/894 |
| 2018/0213205 A1* | 7/2018 | Oh | H01L 27/14627 |
| 2019/0033631 A1* | 1/2019 | Kuo | G02F 1/133711 |
| 2019/0082128 A1* | 3/2019 | Oh | G01S 17/89 |
| 2019/0267403 A1* | 8/2019 | Li | H01L 27/124 |
| 2021/0050515 A1* | 2/2021 | Falk | H10N 70/883 |
| 2021/0160477 A1* | 5/2021 | Oh | G01S 7/4816 |
| 2021/0360177 A1* | 11/2021 | Oh | H04N 25/75 |
| 2021/0377472 A1* | 12/2021 | Oh | G01S 7/4863 |
| 2022/0035038 A1* | 2/2022 | Oh | H01L 27/14654 |
| 2022/0201187 A1* | 6/2022 | Oh | H04N 5/2226 |
| 2022/0224851 A1* | 7/2022 | Oh | H04N 25/76 |

* cited by examiner

TIME-OF-FLIGHT IMAGE SENSOR

BACKGROUND

A time-of-flight camera may be configured to illuminate a scene with a modulated light source and observe the reflected light. A phase shift between the illumination and the reflection may be measured to determine a time of flight for the modulated light to travel from the camera to the scene and back to the camera, and this time of flight may be translated to distances detailing how far objects in the scene are from the camera.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A time-of-flight image sensor is disclosed. The time-of-flight image sensor includes an array of pixels. Each pixel of the array of pixels includes a first photogate, a second photogate adjacent the first photogate, an isolation barrier intermediate the first photogate and the second photogate, and an in-pixel ground node intermediate the first photogate and the second photogate.

DETAILED DESCRIPTION

Figure 1:
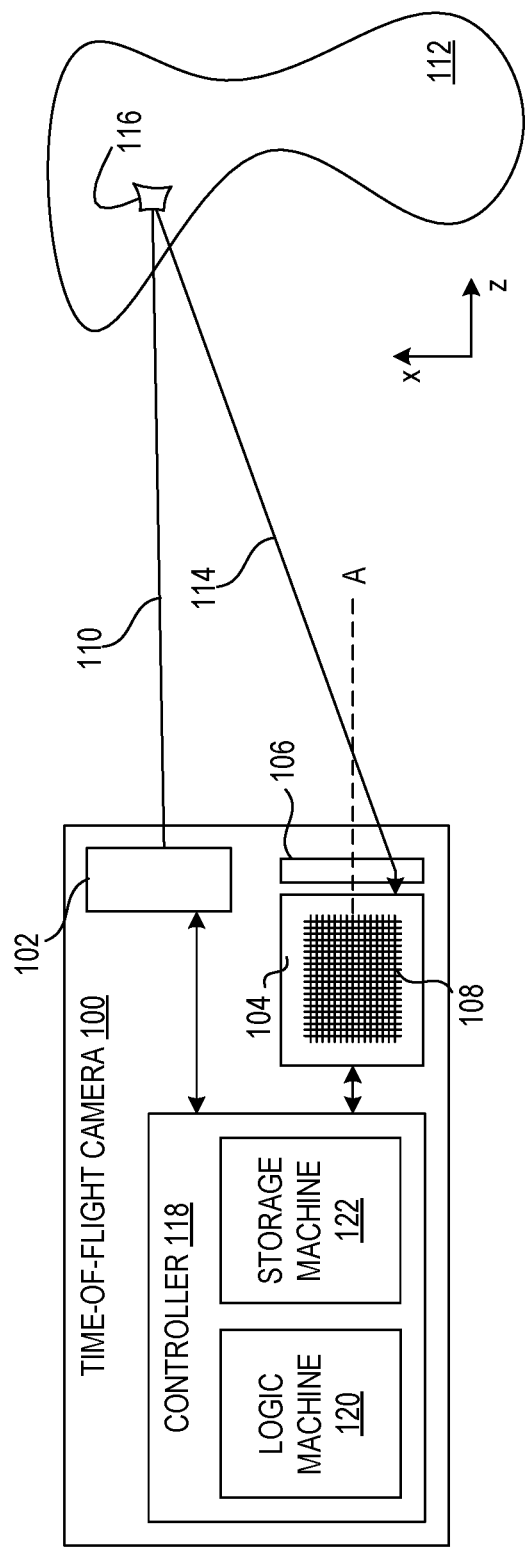
FIG. 1 schematically shows an example time-of-flight camera.

A time-of-flight (TOF) camera may produce a distance measurement derived from a phase shift between illumination light (e.g., infrared light) emitted by a time-of-flight illuminator of the time-of-flight camera and reflection light (e.g., reflected infrared light) received by a time-of-flight image sensor of the time-of-flight camera. The time-of-flight image sensor is configured to translate the reflected light into an electrical charge or electrical signal that is used to determine the phase shift. In particular, each pixel of the time-of-flight image sensor includes a pair of photogates that are configured to collect electrical charge. The pair of photogates are driven with alternating drive signals, such that one photogate is biased with a high voltage when the other photogate is biased with a low voltage and vice versa. The difference in electrical charge collected by the different photogates provides information that is used to determine the phase shift. A ratio of differential and total charge collected by the photogates of a pixel is referred to as demodulation contrast. For conventional time-of-flight image sensors, as a pixel pitch decreases and a distance between photogates within each pixel decreases, under some conditions, a photogate that is biased low can inadvertently collect photo-electrons that preferably would be collected by the other photogate that is biased high. As a result, a demodulation contrast of the time-of-flight image sensor may be reduced.

The present disclosure relates to a time-of-flight image sensor having improved isolation between photogates. In one example, the time-of-flight image sensor includes an array of pixels. Each pixel of the array includes an in-pixel ground node intermediate first and second adjacent photogates. The in-pixel ground node has electrical properties that cooperate with electrical properties of the photogates to enhance a vertical electrical field generated by the pixel. In particular, generated photo-holes are drawn to the in-pixel ground node while generated photo-electrons are drawn to a photogate that is biased with a high voltage (while the other photogate is biased with a low voltage). The drawn photo-holes are held on the surface of the isolation barrier adjacent to the in-pixel ground node due to attractive Coulomb forces from that high-biased photogate. Those held photo-holes enhance the vertical electric field of the entire pixel volume. The enhanced vertical electrical field, in turn, increases an electrical attraction of photo-electrons toward the photogates. This increased electrical attraction causes photo-electrons to travel faster through the pixel volume, such that photo-electrons are more likely to be collected by the high-biased photogate and less likely to be inadvertently collected by the low-biased photogate. Accordingly, the demodulation contrast of the time-of-flight image sensor may be increased relative to a time-of-flight image sensor that does not employ such isolation techniques.

Moreover, because the in-pixel ground node is intermediate the first photogate and the second photogate as opposed to being located at a different position in the pixel, sensor surface area that would have been used for a ground node may be made available for other electronic components. Such a configuration allows for a time-of-flight image sensor to either have an increased pixel resolution or a reduced size of the integrated circuit relative to a time-of-flight image sensor that does not employ such isolation techniques.

Furthermore, for time-of-flight image sensors, an amount of uncertainty in the distance measurement may be sensitive to a signal-to-noise ratio (SNR) of the electrical charge produced by the time-of-flight image sensor. One way to increase signal is to increase a quantum efficiency (QE) of the time-of-flight image sensor. QE is the ratio of the number of charge carriers generated to the number of incident photo-electrons at a given energy. In some implementations, the isolation barrier and the in-pixel ground node may be optimized for a designated wavelength range corresponding to the time-of-flight illumination light, such that side-wall surfaces of the isolation barrier on opposing sides of the in-pixel ground node may be configured to reflect at least some light in the designated wavelength range. Such reflection increases a path of interaction of light through the pixel that increases the QE of the time-of-flight image sensor.

An example time-of-flight camera 100 is described with reference to FIG. 1. The time-of-flight camera 100 is capable of imaging a broad range of subjects, from simple, static topologies to complex, moving subjects such as human beings.

The time-of-flight camera 100 includes a time-of-flight illuminator 102, a time-of-flight image sensor 104, and an objective lens system 106. The time-of-flight camera 100 may also include various other components, such as a wavelength filter (not shown in the drawings) which may be set in front of the time-of-flight image sensor 104 and/or the objective lens system 106.

The time-of-flight illuminator 102 is configured to emit modulated illumination light 110 toward a subject 112. For example, the modulated illumination light 110 may be of an infrared (IR) or near-infrared (NIR) wavelength range. In this example, the objective lens system 106, accordingly, may be transparent or at least highly transmissive in an IR or NIR band corresponding to the modulated illumination light 110. The modulated illumination light 110 may be modulated temporally according to any suitable modulation waveform, including, but not limited to a pulsed or sinusoidal waveform. The time-of-flight illuminator 102 may take any suitable form. In some implementations, the time-of-flight illuminator may include a modulated laser, such as an IR or NIR laser. More particular examples include an edge emitting laser or vertical-cavity surface-emitting laser (VCSEL). In other implementations, the time-of-flight illuminator may include one or more high-power, light-emitting diodes (LEDs).

The objective lens system 106 may be configured to receive the light 114 reflected from the subject 112 and refract such light onto the time-of-flight image sensor 104. In some implementations, the objective lens system 106 may provide a relatively high field of view (FOV). In the illustrated implementation, the objective lens system 106 and the time-of-flight image sensor 104 share a common optical axis A, which is normal to the imaging pixel array and passes through a center of the lens system. The objective lens system 106 may be a compound lens system in some implementations. In more particular configurations, the objective lens system 106 may include five, six, or another number of refractive elements.

The time-of-flight image sensor 104 includes an array of depth-sensing pixels 108, each configured to receive at least some of the reflected modulated illumination light 114 reflected back from a corresponding locus 116 of the subject 112. Each pixel of the array translates light radiation into electrical charge useable to determine the distance from the time-of-flight camera 100 to the subject locus 116 imaged onto that pixel.

A controller 118 of the time-of-flight camera 100 is operatively coupled to the time-of-flight illuminator 102 and to the time-of-flight image sensor 104 and is configured to compute the distance to the locus 116. The controller 118 includes a logic machine 120 and a storage machine 122. The logic machine 120 may include one or more processors configured to execute software instructions. Additionally or alternatively, the logic machine 120 may include one or more hardware or firmware logic machines configured to execute hardware or firmware instructions. Processors of the logic machine 120 may be single-core or multi-core, and the instructions executed thereon may be configured for sequential, parallel, and/or distributed processing. The storage machine 122 includes one or more physical devices configured to hold instructions executable by the logic machine 120 to control operation of the time-of-flight camera 100.

The controller 118 may be configured to provide synchronized, modulated drive signals to the time-of-flight illuminator 102 and to the time-of-flight image sensor 104, to synchronize the operation of these components. In particular, the controller 118 may be configured to modulate emission from the time-of-flight illuminator 102 while synchronously biasing the pixels of the time-of-flight image sensor 104. Also, the controller 118 may be configured to read the output from each pixel of the time-of-flight image sensor 104 to enable computation of a depth map of the subject 112. As used herein, the terms 'depth map' or 'depth image' refer to an array of pixels registered to corresponding loci ($X_i$, $Y_i$) of an imaged subject, with a depth value $Z_i$ indicating, for each pixel, the depth of the corresponding locus. 'Depth' is defined as a coordinate parallel to the optical axis A of the depth camera, which increases with increasing distance from the depth camera. In some implementations, repeated depth imaging may be used to assemble a time-resolved series of depth maps—i.e., depth video.

In some implementations, at least some of the functionality of the controller 118 may be incorporated into the time-of-flight illuminator 102 and/or the time-of-flight image sensor 104. In some implementations, the time-of-flight illuminator 102 and the time-of-flight image sensor 104 may be controlled by separate controllers. In other implementations, the time-of-flight illuminator 102 and the time-of-flight image sensor 104 may be controlled by the same controller.

The time-of-flight camera 100 is provided as a non-limiting example, and other configurations may be employed. In some implementations, various components of the time-of-flight camera 100 may be different or omitted all-together.

Figure 2:
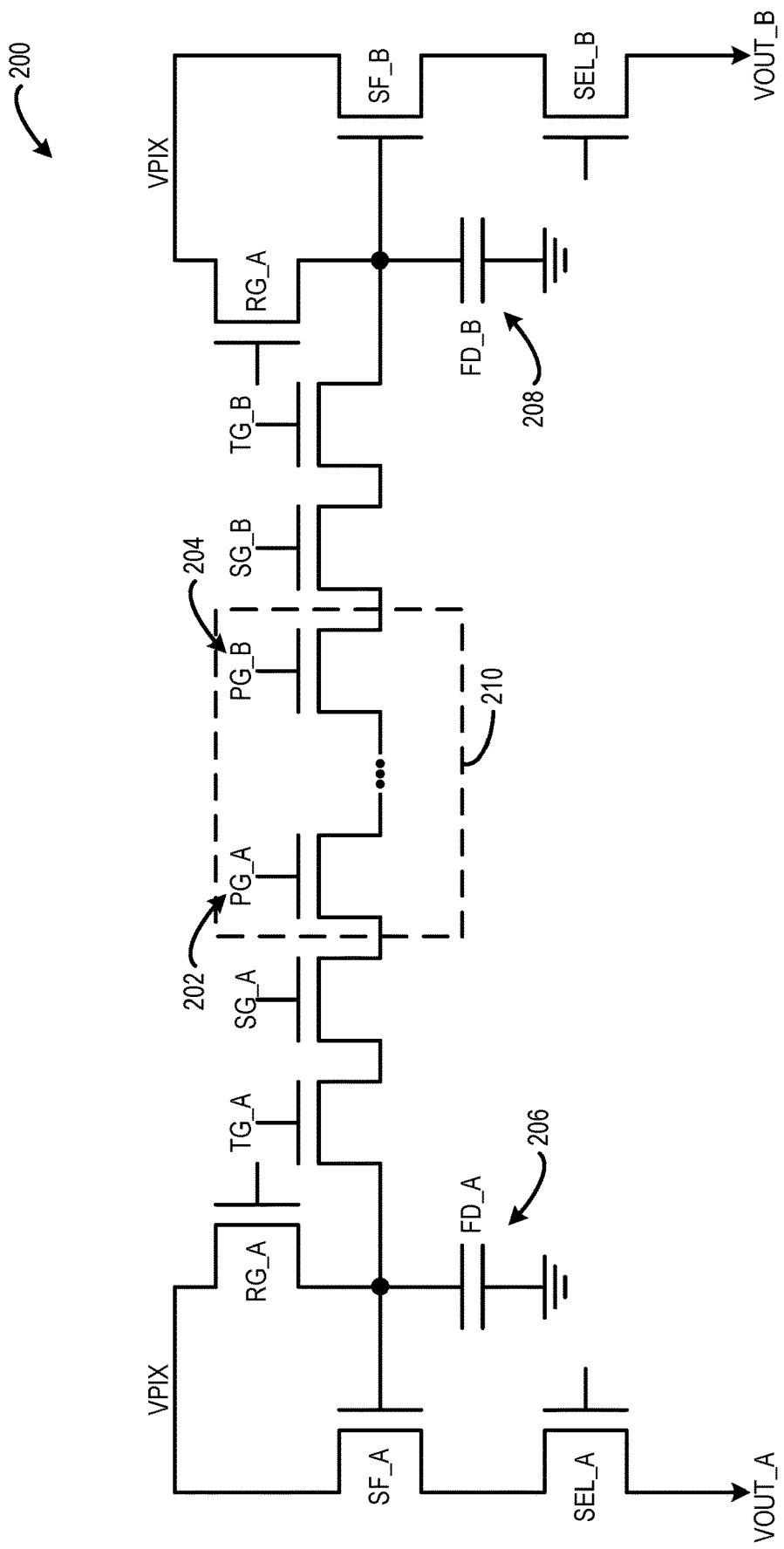
FIG. 2 shows an example transistor-level diagram of an example pixel of a time-of-flight image sensor.

FIG. 2 shows an example transistor-level diagram of an example pixel 200 of a time-of-flight image sensor, such as the time-of-flight image sensor 104 shown in FIG. 1. The pixel 200 includes a first photogate transistor 202 and a second photogate transistor 204 adjacent the first photogate transistor 202. A first charge storage capacitor 206 is configured to record incoming accumulated electrical charge collected by the first photogate transistor 202. A second charge storage capacitor 208 is configured to record incoming accumulated electrical charge collected by the second photogate transistor 202. In one example, the pixel 200 may be operated by controlling the photogate transistors 202, 204 and corresponding charge storage capacitors 206, 208 in an alternating fashion that is synchronized with emission of modulated illumination light from a time-of-flight light illuminator (e.g., time-of-flight light illuminator 102 shown in FIG. 1). In one example, the first and second photogate transistors 202, 204 are driven by a clock source that generates a 50% duty cycle square wave. The square wave alternately biases the photogates with a high voltage and a low voltage. Any suitable voltages may be employed in the drive scheme. In some examples, both the high voltage and the low voltage may be positive (+). The same drive signal may be used to synchronously control the time-of-flight light illuminator. Such synchronous operation correlates the differential charge collected by the capacitors directly to the phase offset of the modulated illumination light such that time of flight and ultimately depth can be determined.

The pixel 200 is provided as a non-limiting example, and other configurations may be employed. In some implementations, various components of the pixel 200 may be different or omitted all-together. The herein discussed isolation and QE improvement techniques may be broadly applicable to a variety of different pixel configurations.

Figure 3:
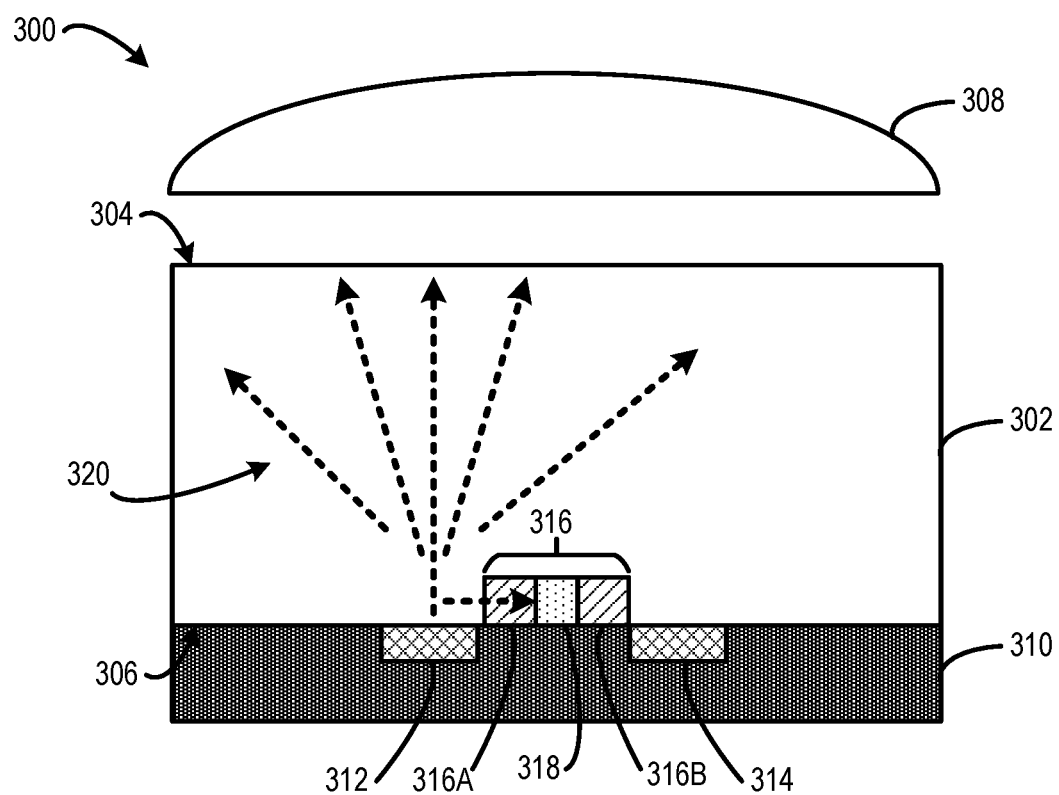
FIG. 3 schematically shows an example pixel of a time-of-flight image sensor.

As discussed above, an in-pixel ground node may be positioned intermediate two adjacent photogates in each pixel of a time-of-flight image sensor to increase isolation between the photogates. FIG. 3 schematically shows aspects of an example pixel 300 of a time-of-flight image sensor that employs such isolation techniques. The aspects of the pixel 300 shown in FIG. 3 correspond to a region of interest 210 of the pixel 200 shown in the transistor-level diagram in FIG. 2. Further, the pixel 300 is illustrated as a "vertical" cross-section along line A-A shown in FIG. 8. The pixel 300 is shown in simplified form. In the illustrated example, the pixel 300 is a backside-illuminated (BSI) pixel. In some examples, the pixel may take another form. The pixel 300 may be one of numerous pixels included in a sensor array of a time-of-flight image sensor, such as the time-of-fight image sensor 104 shown in FIG. 1.

In the illustrated example, the pixel 300 is a complementary metal-oxide-semiconductor (CMOS) sensor constructed using the CMOS process. In other examples, other fabrication processes may be employed. The pixel 300 includes a semiconductor layer 302 configured to translate light into electrical charge. The semiconductor layer 302 includes an input side 304 and a detector side 306 opposite the input side 304. In one example, the semiconductor layer 302 includes Silicon. In another example, the semiconductor layer 302 includes Germanium. In yet another example, the semiconductor layer 302 includes both Silicon and Germanium. The semiconductor layer 302 may include any suitable material configured to translate light into electrical charge.

An optical element 308 may be proximate to the input side 304 of the semiconductor layer 302. The optical element 308 may be configured to focus and/or concentrate input light from the surrounding environment into the semiconductor layer 302 of the pixel 300. In one example, the optical element 308 includes a microlens. The microlens may be incorporated into an array of microlenses formed on a supporting substrate that is coupled on the input side of the semiconductor layer 302.

A dielectric layer 310 may be formed on the detector side 306 of the semiconductor layer 302. The dielectric layer 310 may electrically insulate the semiconductor layer 302. In one example, the dielectric layers 310 includes silicon oxide ($SiO_2$) and silicon nitride. In other examples, the dielectric layer 310 may include other insulating material(s).

A first photogate 312 and a second photogate 314 are deposited on the detector side 306 of the semiconductor layer 302. In one example, the first and second photogates 312, 314 include polysilicon. In other examples, the first and second photogates include other materials. Each of the first and second photogates 312, 314 is configured to collect photo-electrons when the photogate is driven with a clock signal that biases the photogate high. In other words, when a photogate is activated by a drive signal, electrical charge flows from the semiconductor layer 302 through the photogate.

An isolation barrier 316 (e.g., 316A, 316B) is formed in the semiconductor layer 302 intermediate the first photogate 312 and the second photogate 314. In some implementations, the isolation barrier 316 may comprise a shallow isolation trench. A non-limiting example fabrication process for creating the shallow isolation trench includes etching a pattern in the semiconductor layer, depositing one or more dielectric materials (e.g., silicon dioxide) to fill the trench, and removing the excess dielectric using a technique such as chemical-mechanical planarization. A shallow isolation trench may be formed intermediate the first and second photogates according to any suitable fabrication process. In some implementations, the isolation barrier 316 may comprise a P-type implant. The isolation barrier 316 may comprise any suitable material or structure that is configured to help electrically isolate one photogate from the other photogate to reduce leakage of photo-electrons from one photogate to the other photogate.

An in-pixel ground node 318 intermediate the first photogate 312 and the second photogate 314 further increases electrical isolation between the first photogate 312 and the second photogate 314. The in-pixel ground node 318 is configured to ground the semiconductor layer 302 such that holes formed by the absence of photo-electrons in the semiconductor layer 302 drain through the in-pixel ground node 318. The draining of such holes may cause an electrical attraction of photo-electrons to the region of the in-pixel ground node 318.

In some implementations, the in-pixel ground node 318 may comprise a P+ implant. In other implementations, the in-pixel ground node 318 may comprise a different material. In the illustrated implementation, the first photogate 312 and the second photogate 314 are coplanar on a surface of the detector side 306 of the semiconductor layer 302, and the in-pixel ground node 318 is embedded in the isolation barrier 316 on the surface of the detector side 306 of the semiconductor layer 302. The in-pixel ground node 318 is embedded in the isolation barrier 316 such that a first isolation barrier 316A and a second isolation barrier 316B are formed on opposing sides of the in-pixel ground node 318. In particular, the first isolation barrier 316A is intermediate the in-pixel ground node 318 and the first photogate 312 and the second isolation barrier 316B is intermediate the in-pixel ground node 318 and the second photogate 314. The in-pixel ground node 318 may be equidistant from the first and second photogates 312, 314. In other examples, the in-pixel ground node may be spaced differently between the photogates and/or may be shifted up or down relative to the surface of the detector side 306 of the semiconductor layer 302.

The electrical characteristics of the in-pixel ground node 318 may cause an increase in a vertical electrical field 320 in a region of the semiconductor layer 302 proximate to the in-pixel ground node 318. The increase in the vertical electrical field 320 near the photogates 312, 314 may cause photo-electrons to travel through the semiconductor layer 302 at a higher speed toward a high biased photogate such that the photo-electrons are less likely to drift toward a low biased photogate. As such, demodulation contrast of the pixel 300 may be increased relative to a pixel that does not employ such isolation techniques. Such benefits are illustrated in FIGS. 5-6 and discussed in further detail below.

Figure 4:
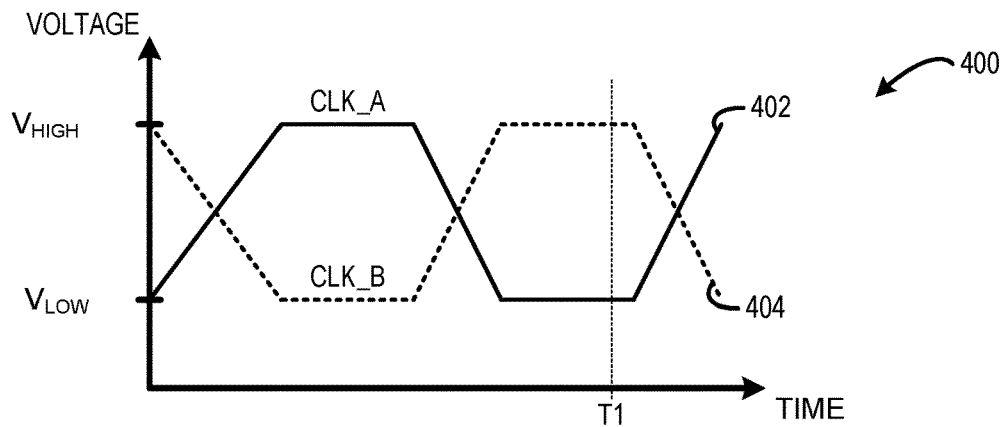
FIG. 4 is a graph showing a cycle of an example drive scheme for a pixel of a time-of-flight image sensor.

FIG. 4 is a graph 400 showing a cycle of an example drive scheme for a pixel of a time-of-flight image sensor. A first clock signal (CLK_A) 402 controls operation of a first photogate (e.g., PG_A) of a pixel. The first clock signal 402 alternates between a high voltage and a low voltage. In the illustrated example, both the high voltage and the low voltage are positive. A second clock signal (CLK_B) 404 controls operation of a second photogate (e.g., PG_B) of the pixel. The second clock signal 404 alternates between the low voltage and the high voltage. According to the drive scheme, when one photogate is biased with the high voltage (i.e., turned on) the other photogate is biased with the low voltage (i.e., turned off).

Figure 5:
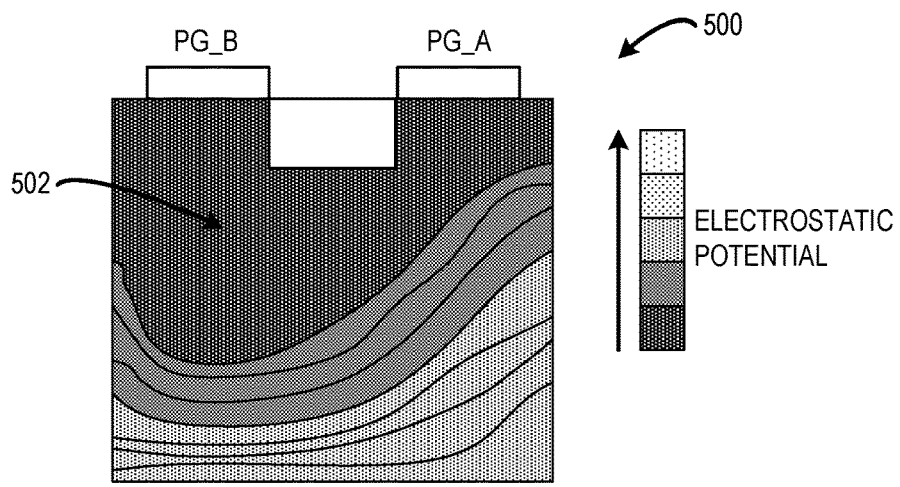
FIG. 5 is a theoretical electrostatic potential diagram for an example pixel that does not include an in-pixel ground node intermediate first and second photogates of the pixel.

FIG. 5 shows a theoretical electrostatic potential diagram 500 for an example pixel that does not include an in-pixel ground node intermediate first and second photogates of the pixel. The operating state of the pixel shown in the electrostatic potential diagram 500 corresponds to time T1 on the graph 400 shown in FIG. 4. In this operating state, the first photogate (PG_A) is biased with the low voltage and the second photogate (PG_B) is biased with the high voltage. As shown in the electrostatic potential diagram 500, a large high potential region 502 surrounds both the first and second photogates where holes in the e-field are depleted due the holes being drained to an in-pixel ground node located elsewhere in the pixel away from the photogates. The depleted region 502 produces a relatively weak vertical electrical field in the semiconductor layer of the pixel that allows for photo-electrons to be unintentionally collected by the first photogate that is supposed to be "turned off", because the first photogate is still positively biased albeit at a lower voltage than the second photogate.

Figure 6:
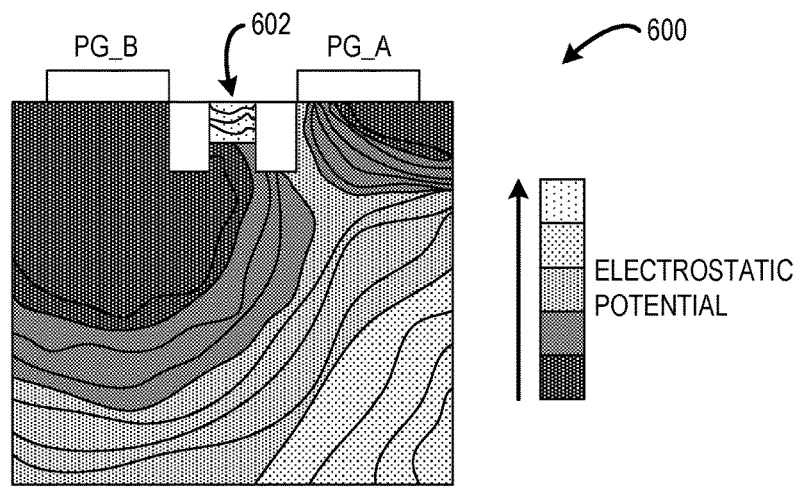
FIG. 6 is a theoretical electrostatic potential diagram for an example pixel that includes an in-pixel ground node intermediate first and second photogates of the pixel.

FIG. 6 is a theoretical electrostatic potential diagram 600 for an example pixel that includes an in-pixel ground node intermediate first and second photogates of the pixel. The operating state of the pixel shown in the electrostatic potential diagram 500 corresponds to time T1 on the graph 400 shown in FIG. 4. In this operating state, the first photogate (PG_A) is biased with the low voltage and the second photogate (PG_B) is biased with the high voltage. As shown in the electrostatic potential diagram 600, holes are drained through the in-ground pixel node intermediate the first and second photogates while generated photo-electrons are drawn to the high-biased photogate. The drawn photo-holes are held on the surface of the isolation barrier adjacent to the in-pixel ground node due to attractive Coulomb forces from that high-biased photogate resulting in a high electrostatic potential region 602 proximate to the photogates. The high electrostatic potential region 602 increases the strength of the vertical electrical field in the semiconductor layer, which in turn, increases a drift velocity of the photo-electrons through the semiconductor layer. The increased drift velocity of the photo-electrons reduces the likelihood of photo-electrons unintentionally being collected by the first photogate that is biased low (i.e., turned off). In this way, the demodulation contrast of a time of flight sensor including an array of pixels having an in-pixel ground node intermediate first and second photogates of the pixels may be increased relative to a time-of-flight sensor where an in-pixel ground node is located elsewhere.

Figure 7:
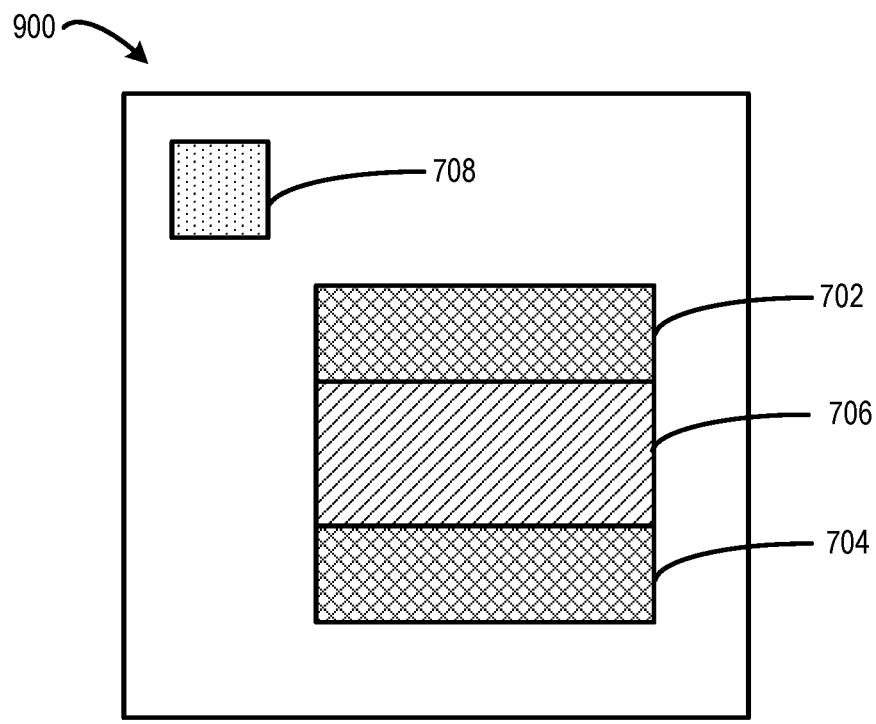
FIG. 7 schematically shows an example pixel that does not include an in-pixel ground node intermediate first and second photogates of the pixel.

Furthermore, locating an in-pixel ground node intermediate photogates in each pixel of a time-of-flight image sensor may provide additional benefits related to reducing a size of the time-of-flight image sensor. FIG. 7 schematically shows an example pixel 700 that does not include an in-pixel ground node intermediate first and second photogates of the pixel. The pixel 700 includes a first photogate 702, a second photogate 704, and an isolation barrier 706 intermediate the first photogate 702 and the second photogate 704. Additionally, the pixel 700 includes an in-pixel ground node 708 that is not embedded in the isolation barrier 706 intermediate the first and second photogates 702, 704. Instead, the in-pixel ground node 708 is located elsewhere in the pixel 700.

Figure 8:
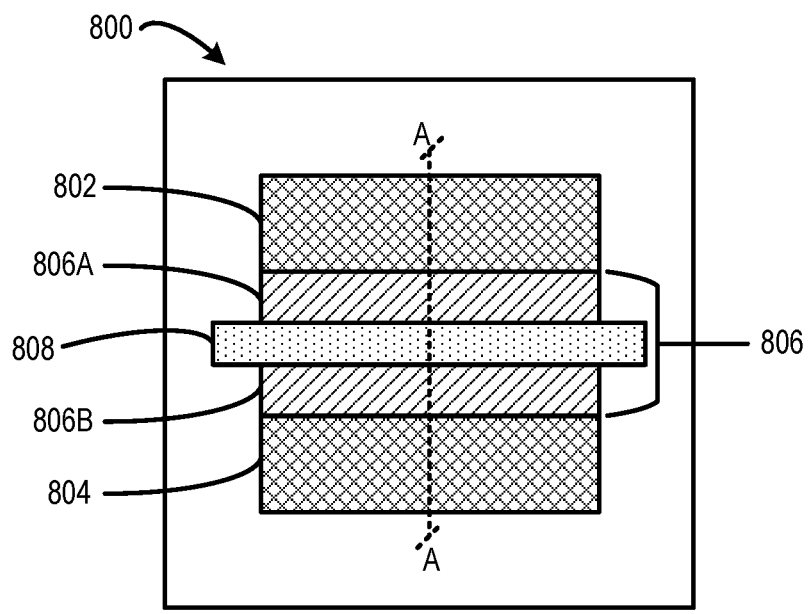
FIG. 8 schematically shows an example pixel that includes an in-pixel ground node intermediate first and second photogates of the pixel.

FIG. 8 schematically shows an example pixel 800 that includes an in-pixel ground node intermediate first and second photogates of the pixel. The pixel 800 includes a first photogate 802, a second photogate 804, and an isolation barrier 806 (e.g., 806A, 806B) intermediate the first photogate 802 and the second photogate 804. Additionally, the pixel 800 includes an in-pixel ground node 808 that is embedded in the isolation barrier 806 intermediate the first and second photogates 802, 804. By locating the in-pixel ground node 808 intermediate the first and second photogates 802, 804, as opposed to being located at a different position in the pixel, an overall size of the pixel 800 may be reduced relative to an overall size of the pixel 700 that needs additional surface area to accommodate the in-pixel ground node 708. Such a configuration allows for a time-of-flight image sensor to either have an increased pixel resolution or a reduced size of the integrated circuit relative to a time-of-flight image sensor that does not employ such isolation techniques.

Figure 9:
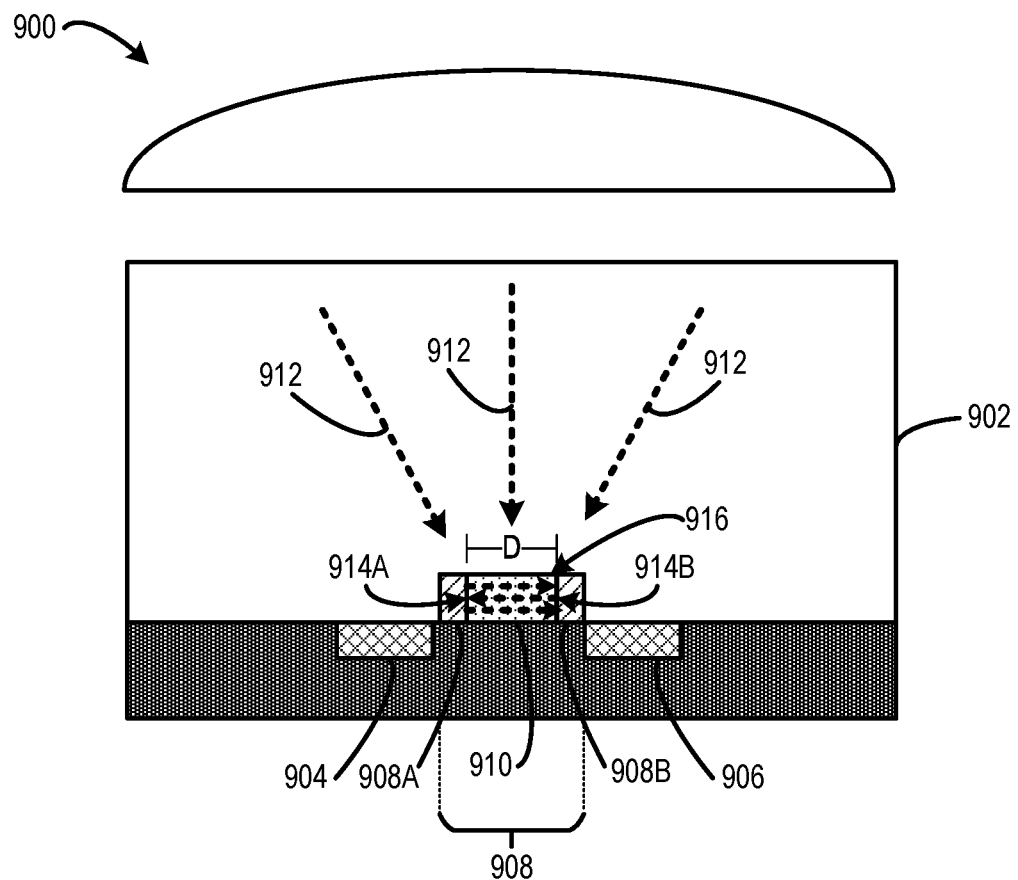
FIG. 9 shows an example pixel configured such that at least some light in a designated wavelength range resonates between side-wall surfaces of an isolation barrier in the pixel.

Furthermore, in some implementations, an in-pixel ground node may be embedded in an isolation barrier in such a manner that allows for an optical path length of at least some illumination light traveling through a pixel to be extended to improve QE of a time-of-flight image sensor. FIG. 9 shows an example pixel 900 configured such that at least some light in a designated wavelength range resonates between side-wall surfaces of an isolation barrier in the pixel. The pixel 900 includes a semiconductor layer 902, a first photogate 904, and a second photogate 906. An isolation barrier 908 is intermediate the first photogate 904 and the second photogate 906. An in-pixel ground node 910 is embedded in the isolation barrier 908 such that the isolation barrier includes a first portion 908A and a second portion 908B on opposing sides of the in-pixel ground node 910. When light 912 enters the semiconductor layer 902, at least some light impinges on the isolation barrier 908. A distance (D) between a first side-wall surface 914A of the first portion of the isolation barrier 908A and a second side-wall surface 914B of the second portion of the isolation barrier 908B is configured such that at least some light 916 in a designated resonance wavelength range resonates between the side-wall surfaces 914A, 914B. Each time light traverses between these side-wall surfaces, the semiconductor layer 902 may translate light into electrical charge, and an interaction path through the semiconductor layer 902 may be extended. Moreover, each time light traverses between these side-wall surfaces, the light may experience an optical phase delay that may causes constructive interference that increases absorption of light in the resonance wavelength range. Accordingly, the QE of a time-of-flight image sensor including such a pixel configuration may be increased relative to other pixel configurations.

The resonance wavelength may be tuned to any suitable wavelength range by adjusting the distance between the side-wall surfaces of the isolation barriers 908A, 908B on opposing sides of the in-pixel ground node 910. In one example, the resonance wavelength range may be particularly tuned to a wavelength range of illumination light emitted by a light source (e.g., time-of-flight illuminator 102 shown in FIG. 1) that is detected by a time-of-flight image sensor (e.g., time-of-flight image sensor 104 shown in FIG. 1).

A time-of-flight image sensor that has a sensor array including a plurality of pixels that are configured in the manner described herein may have increased demodulation contrast, increased QE, and increased pixel resolution and/or reduced sensor size relative to other pixel configurations where an in-pixel ground node is not intermediate photogates of each pixel. Such a time-of-flight sensor may be employed in any suitable camera or other time-of-flight sensing device.

In an example, a time-of-flight image sensor comprises an array of pixels, each pixel of the array comprising a first photogate, a second photogate adjacent the first photogate, an isolation barrier intermediate the first photogate and the second photogate, and an in-pixel ground node intermediate the first photogate and the second photogate. In this example and/or other examples, the in-pixel ground node may be embedded in the isolation barrier. In this example and/or other examples, the isolation barrier may comprise a P-type implant. In this example and/or other examples, the isolation barrier may comprise a shallow isolation trench. In this example and/or other examples, the in-pixel ground node may comprise a P+ implant. In this example and/or other examples, the time-of-flight image sensor may further comprise a controller configured to bias one photogate of the first and second photogates with a high voltage and bias the other photogate of the first and second photogates with a low voltage, and the in-pixel ground node may be configured to increase a strength of a vertical electric field of the pixel thereby increasing an attraction of photo-electrons toward a photogate that is biased with the high voltage. In this example and/or other examples, the first photogate and the second photogate may be coplanar on a surface of a semiconductor layer, and the in-pixel ground node may be embedded on the surface of the semiconductor layer. In this example and/or other examples, the time-of-flight image sensor may be configured to measure active illumination light within a designated wavelength range, the in-pixel ground node may be embedded in the isolation barrier, and side-wall surfaces of the isolation barrier on opposing sides of the in-pixel ground node may be configured to reflect at least some light in the designated wavelength range. In this example and/or other examples, the side-wall surfaces of the isolation barrier on opposing sides of the in-pixel ground node may be configured such that at least some light in the designated wavelength range resonates between the side-wall surfaces.

In an example, a time-of-flight camera comprises a time-of-flight illuminator configured to emit active illumination light toward a scene, and a time-of-flight image sensor comprising an array of pixels configured to measure the active illumination light reflected back from the scene toward the time-of-flight image sensor, each pixel of the array comprising a first photogate, a second photogate adjacent the first photogate, an isolation barrier intermediate the first photogate and the second photogate, an in-pixel ground node intermediate the first photogate and the second photogate. In this example and/or other examples, the in-pixel ground node may be embedded in the isolation barrier. In this example and/or other examples, the isolation barrier may comprise a P-type implant. In this example and/or other examples, the isolation barrier may comprise a shallow isolation trench. In this example and/or other examples, the in-pixel ground node may comprise a P+ implant. In this example and/or other examples, the time-of-flight camera may further comprise a controller configured to bias one photogate of the first and second photogates with a high voltage and bias the other photogate of the first and second photogates with a low voltage, and the in-pixel ground node may be configured to increase a strength of a vertical electric field of the pixel thereby increasing an attraction of photo-electrons toward a photogate that is biased with the high voltage. In this example and/or other examples, the first photogate and the second photogate may be coplanar on a surface of a semiconductor layer, and the in-pixel ground node may be embedded on the surface of the semiconductor layer. In this example and/or other examples, the time-of-flight illuminator may be configured to emit active illumination light in a designated wavelength range, the time-of-flight image sensor may be configured to measure the active illumination light in the designated wavelength range, the in-pixel ground node may be embedded in the isolation barrier, and side-wall surfaces of the isolation barrier on opposing sides of the in-pixel ground node may be configured to reflect at least some light in the designated wavelength range. In this example and/or other examples, the side-wall surfaces of the isolation barrier on opposing sides of the in-pixel ground node may be configured such that at least some light in the designated wavelength range resonates between the side-wall surfaces.

In an example, a time-of-flight image sensor configured to measure illumination light in a designated wavelength range comprises an array of pixels, each pixel of the array comprising a first photogate, a second photogate adjacent the first photogate, an isolation barrier intermediate the first photogate and the second photogate, and an in-pixel ground node embedded in the isolation barrier, wherein side-wall surfaces of the isolation barrier on opposing sides of the in-pixel ground node are configured to reflect at least some light in the designated wavelength range. In this example and/or other examples, the side-wall surfaces of the isolation barrier on opposing sides of the in-pixel ground node may be configured such that at least some light in the designated wavelength range resonates between the side-wall surfaces.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A time-of-flight image sensor comprising:
  an array of pixels, each pixel of the array comprising:
    a first photogate;
    a second photogate adjacent the first photogate;
    an isolation barrier intermediate the first photogate and the second photogate; and
    an in-pixel ground node intermediate the first photogate and the second photogate.

2. The time-of-flight image sensor of claim 1, wherein the in-pixel ground node is embedded in the isolation barrier.

3. The time-of-flight image sensor of claim 1, wherein the isolation barrier comprises a P-type implant.

4. The time-of-flight image sensor of claim 1, wherein the isolation barrier comprises a shallow isolation trench.

5. The time-of-flight image sensor of claim 1, wherein the in-pixel ground node comprises a P+ implant.

6. The time-of-flight image sensor of claim 1, further comprising:
  a controller configured to bias one photogate of the first and second photogates with a high voltage and bias the other photogate of the first and second photogates with a low voltage; and wherein the in-pixel ground node is configured to increase a strength of a vertical electric field of the pixel thereby increasing an attraction of photo-electrons toward a photogate that is biased with the high voltage.

7. The time-of-flight image sensor of claim 1, wherein the first photogate and the second photogate are coplanar on a surface of a semiconductor layer, and wherein the in-pixel ground node is embedded on the surface of the semiconductor layer.

8. The time-of-flight image sensor of claim 1, wherein the time-of-flight image sensor is configured to measure active illumination light within a designated wavelength range, wherein the in-pixel ground node is embedded in the isolation barrier, and wherein side-wall surfaces of the isolation barrier on opposing sides of the in-pixel ground node are configured to reflect at least some light in the designated wavelength range.

9. The time-of-flight image sensor of claim 8, wherein the side-wall surfaces of the isolation barrier on opposing sides of the in-pixel ground node are configured such that at least some light in the designated wavelength range resonates between the side-wall surfaces.

10. A time-of-flight camera comprising:
a time-of-flight illuminator configured to emit active illumination light toward a scene; and
a time-of-flight image sensor comprising:
an array of pixels configured to measure the active illumination light reflected back from the scene toward the time-of-flight image sensor, each pixel of the array comprising:
a first photogate;
a second photogate adjacent the first photogate;
an isolation barrier intermediate the first photogate and the second photogate; and
an in-pixel ground node intermediate the first photogate and the second photogate.

11. The time-of-flight camera of claim 10, wherein the in-pixel ground node is embedded in the isolation barrier.

12. The time-of-flight camera of claim 10, wherein the isolation barrier comprises a P-type implant.

13. The time-of-flight camera of claim 10, wherein the isolation barrier comprises a shallow isolation trench.

14. The time-of-flight camera of claim 10, wherein the in-pixel ground node comprises a P+ implant.

15. The time-of-flight camera of claim 10, further comprising:
a controller configured to bias one photogate of the first and second photogates with a high voltage and bias the other photogate of the first and second photogates with a low voltage; and
wherein the in-pixel ground node is configured to increase a strength of a vertical electric field of the pixel thereby increasing an attraction of photo-electrons toward a photogate that is biased with the high voltage.

16. The time-of-flight camera of claim 10, wherein the first photogate and the second photogate are coplanar on a surface of a semiconductor layer, and wherein the in-pixel ground node is embedded on the surface of the semiconductor layer.

17. The time-of-flight camera of claim 10, wherein the time-of-flight illuminator is configured to emit active illumination light in a designated wavelength range, wherein the time-of-flight image sensor is configured to measure the active illumination light in the designated wavelength range, wherein the in-pixel ground node is embedded in the isolation barrier, and wherein side-wall surfaces of the isolation barrier on opposing sides of the in-pixel ground node are configured to reflect at least some light in the designated wavelength range.

18. The time-of-flight camera of claim 17, wherein the side-wall surfaces of the isolation barrier on opposing sides of the in-pixel ground node are configured such that at least some light in the designated wavelength range resonates between the side-wall surfaces.

19. A time-of-flight image sensor configured to measure illumination light in a designated wavelength range, the time-of-flight image sensor comprising:
an array of pixels, each pixel of the array comprising:
a first photogate;
a second photogate adjacent the first photogate;
an isolation barrier intermediate the first photogate and the second photogate; and
an in-pixel ground node embedded in the isolation barrier, wherein side-wall surfaces of the isolation barrier on opposing sides of the in-pixel ground node are configured to reflect at least some light in the designated wavelength range.

20. The time-of-flight image sensor of claim 19, wherein the side-wall surfaces of the isolation barrier on opposing sides of the in-pixel ground node are configured such that at least some light in the designated wavelength range resonates between the side-wall surfaces.

* * * * *